ус010620492В2

(12) United States Patent
Su et al.

(10) Patent No.: US 10,620,492 B2
(45) Date of Patent: Apr. 14, 2020

(54) METHOD FOR MANUFACTURING ARRAY SUBSTRATE, ARRAY SUBSTRATE AND DISPLAY DEVICE

(71) Applicants: BOE TECHNOLOGY GROUP CO., LTD., Beijing (CN); Chengdu BOE Optoelectronics Technology Co., Ltd., Sichuan Province (CN)

(72) Inventors: Lei Su, Beijing (CN); Xiaofei Yang, Beijing (CN); Xu Liu, Beijing (CN); Xinghua Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 28 days.

(21) Appl. No.: 15/941,259

(22) Filed: Mar. 30, 2018

(65) Prior Publication Data

US 2019/0086745 A1    Mar. 21, 2019

(30) Foreign Application Priority Data

Sep. 19, 2017 (CN) .......................... 2017 1 0848240

(51) Int. Cl.
*G02F 1/1362* (2006.01)
*H01L 27/02* (2006.01)
(Continued)

(52) U.S. Cl.
CPC .... *G02F 1/136204* (2013.01); *G02F 1/13439* (2013.01); *G02F 1/134336* (2013.01);
(Continued)

(58) Field of Classification Search
CPC ... H01L 2224/3013; H01L 2224/30131; H01L 23/49838; H01L 23/49844; H01L 27/0292;
(Continued)

(56) References Cited

U.S. PATENT DOCUMENTS 5,691,786 A * 11/1997 Nakai ............... G02F 1/136213
349/39
7,119,872 B2 * 10/2006 Choi ................. G02F 1/136259
349/192
(Continued)

FOREIGN PATENT DOCUMENTS

CN        106057823 A      10/2016
CN        106356381 A       1/2017

OTHER PUBLICATIONS

First Office Action for Chinese Patent Application No. 201710848240.0 dated Jul. 18, 2019.

*Primary Examiner* — Earl N Taylor
(74) *Attorney, Agent, or Firm* — Calfee, Halter & Griswold LLP

(57) ABSTRACT

The present disclosure relates to a method for manufacturing an array substrate, an array substrate and a display device. The method includes: disposing, on a substrate, a plurality of thin film transistors arranged in an array; depositing a first transparent electrode layer on the substrate and processing the first transparent electrode layer by using a first pattern process, so as to form a plurality of first electrodes connected with drains of the film transistors, and a connecting electrode connecting adjacent ones of the first electrodes; disposing a functional structure on a side of the first transparent electrode layer that is away from the substrate; and processing the connecting electrode by using a second pattern process and disconnecting the connecting electrode,
(Continued)

so as to form a convex connection on an edge of the first electrode.

4 Claims, 6 Drawing Sheets

(51) Int. Cl.
    *H01L 27/12*     (2006.01)
    *G02F 1/1343*     (2006.01)
    *G02F 1/1333*     (2006.01)
    *G02F 1/1368*     (2006.01)

(52) U.S. Cl.
    CPC .... *G02F 1/136286* (2013.01); *H01L 27/0288* (2013.01); *H01L 27/0292* (2013.01); *H01L 27/124* (2013.01); *G02F 1/1368* (2013.01); *G02F 1/133365* (2013.01); *G02F 2001/136295* (2013.01); *G02F 2201/123* (2013.01); *H01L 27/1262* (2013.01)

(58) Field of Classification Search
    CPC ............. H01L 27/124; G02F 1/134309; G02F 1/134336; G02F 1/13439; G02F 1/136286
    See application file for complete search history.

(56) References Cited

U.S. PATENT DOCUMENTS

| | | | |
|---|---|---|---|
| 2004/0125332 A1* | 7/2004 | Choi | G02F 1/136259 349/190 |
| 2013/0293819 A1* | 11/2013 | Liao | G02F 1/1345 349/142 |
| 2015/0187857 A1* | 7/2015 | Negishi | H01L 27/3272 257/40 |
| 2017/0104016 A1 | 4/2017 | Wang | |
| 2018/0342558 A1* | 11/2018 | Hirata | H04N 5/357 |
| 2018/0373079 A1* | 12/2018 | Yeh | G02F 1/13338 |
| 2019/0086745 A1* | 3/2019 | Su | G02F 1/136204 |

* cited by examiner

METHOD FOR MANUFACTURING ARRAY SUBSTRATE, ARRAY SUBSTRATE AND DISPLAY DEVICE

CROSS REFERENCE

The present application claims the priority of Chinese Patent Application No. 201710848240.0, filed on Sep. 19, 2017, and the entire contents thereof are incorporated herein by reference as part of the present application.

TECHNICAL FIELD

The present disclosure relates to the liquid crystal display field, particularly, to a method for manufacturing an array substrate, an array substrate and a display device.

BACKGROUND

Liquid crystal display has advantages such as thin profile, low power consumption, low radiation, soft vision and the like, and has a quick development in recent years. The main structure of the liquid crystal display is a display panel which includes backlight module, an array substrate and a color filter substrate which are disposed opposite to each other, and a liquid crystal polymer packaged between the array substrate and the color filter substrate. The array substrate is disposed with structures such as gate lines, signal lines and thin film transistors and the like. The gate lines and the signal lines are used to define a plurality of pixel regions, each of which includes a pixel electrode. The film transistor is used as switch devices which are used to control the pixel electrode and the common electrode to generate an electric field for driving the liquid crystal to deflect, thereby realizing display.

SUMMARY

According to an aspect of the present disclosure, there is provided a method for manufacturing an array substrate, which includes the following steps.

A plurality of thin film transistors arranged in an array is disposed on a substrate.

A first transparent electrode layer is deposited on the substrate and the first transparent electrode layer is processed by using a first pattern process, so as to form a plurality of first electrodes connected with drains of the thin film transistors and a connecting electrode connecting adjacent ones of the first electrodes.

A functional structure is disposed on a side of the first transparent electrode layer that is away from the substrate.

The connecting electrode is processed by using a second pattern process and the connecting electrode is disconnected, so as to form a convex connection on an edge of the first electrode.

According to an embodiment of the present disclosure, the disposing a functional structure including:

disposing a signal line on a side of the connecting electrode that is away from the substrate;

disposing a passivation layer on a side of the first electrode and the side of the connecting electrode that are away from the substrate; and depositing a second transparent electrode layer on a side of the passivation layer that is away from the first electrodes and forming a second electrode.

According to an embodiment of the present disclosure, the method further includes:

processing the passivation layer by using a third pattern process such that a first via is formed at a position corresponding to the connecting electrode.

According to an embodiment of the present disclosure, after forming the first via, the method further includes:

processing the second transparent electrode layer at the first via and the connecting electrode by using the second pattern process such that a second via is formed on the second transparent electrode layer, forming the convex connection and the signal line connection based on the connecting electrode.

A size of the second via is not greater than that of the first via.

According to an aspect of the present disclosure, there is provided an array substrate manufactured with the above-identified methods.

According to an aspect of the present disclosure, there is provided an array substrate which includes:

a substrate;

a plurality of thin film transistors disposed on the substrate;

a plurality of first electrodes arranged in an array, which are connected with drains of the transistors. An edge of the first electrode has a convex connection applicable to connect adjacent ones of the first electrode to form an equipotential during manufacturing the array substrate.

According to an embodiment of the present disclosure, the convex connections between the adjacent ones of the first electrodes are disposed opposite to each other.

According to an embodiment of the present disclosure, the first electrode has four edges, each of which has one said convex connection.

According to an embodiment of the present disclosure, the array substrate further includes:

a signal line connection, disposed on a same layer as the layer where the first electrode is disposed, and independently disposed in the gap between the two adjacent first electrodes; and a signal line, disposed a side of the signal line connection that is away from the substrate and covering the signal line connection.

According to an embodiment of the present disclosure, the array substrate includes a plurality of the signal line connections which are disposed in a row direction or a column direction of the plurality of the first electrodes that are arranged in the array. An extension direction of the signal line is the same as the direction in which the signal line connections are disposed.

According to an embodiment of the present disclosure, the signal line connections and the convex connections are arranged on a same layer and formed of a same material.

According to an embodiment of the present disclosure, the array substrate further includes:

a passivation layer, disposed on a side of the first electrode that is away from the substrate, wherein the passivation layer is disposed with a first via at a position corresponding to the convex connection; and a second electrode, disposed on a side of the passivation layer that is away from the first electrodes, wherein the second electrode is disposed with a second via at a position corresponding to the first via.

A size of the second via is not greater than that of the first via.

According to an aspect of the present disclosure, there is provided with a display device including the above-identified array substrate.

It is appreciated that the above general description and the following detailed description are merely exemplary and explanatory, and cannot limit to the present disclosure.

This section provides the summary of the various implementations and examples of the technologies described in the present disclosure, which does not include the entire scope of the technologies of the present disclosure and all features of the present disclosure.

BRIEF DESCRIPTION OF THE DRAWINGS

The above mentioned and/or additional aspects and advantages in the present disclosure will be obvious and readily understood from the description of embodiments in connection with the drawings, where.

REFERENCE NUMBER

100: substrate; 200: first electrode; 201: connecting electrode; 211: connection; 212: signal line connection; 300: thin film transistor; 310: source; 320: drain; 330: gate; 340: active layer; 400: gate insulating layer; 500: passivation layer; 600: second electrode; 700: first via; 800: second via; 10: signal line; 20: gate line; 1: passage 1; 2: passage 2.

DETAILED DESCRIPTION

The detailed description will be given to embodiments of the present disclosure which are shown in drawings. The similar or same reference number refers to the same or similar element or the element having the same or similar function throughout the specification. The embodiments described in connection with the drawings are merely exemplary and used for explanation of the present disclosure, they are not to be interpreted as the limitation to the present disclosure.

The present disclosure is made by the inventor based on discovery and recognition of the following facts and problems.

In current, there is a problem for the liquid crystal display that the yield is relative low. After further development and an amount of experiments, the inventor has found that the problem is mainly caused by various deficiencies that are caused by electrostatic discharge during manufacturing the array substrate. Specifically, during manufacturing the array substrate, when depositing the transparent electrode layer (for example, an ITO layer) to form the square pixel electrode, since the ITO layer has electric conductivity, static electricity may be easy to be accumulated on the pixel electrode and be discharged, thereby producing various deficiencies. In addition, some processes such as magnetron sputtering and chemical vapor deposition are employed during manufacturing the metal layer and the semiconductive layer. Since the above manufacturing processes may cause plasma glow-discharge, which may cause electrostatic discharge defects. The inventor has found that static electricity accumulated during manufacturing of an array substrate may be discharge into the film transistor through the drain of the film transistor connected with the pixel electrode, and may further cause breakdown of the gate insulating layer and the active layer between the drain and the gate, such that metals of the source and the drain is shorted with the metal of the gate, thereby infecting the usage of the film transistor and further infecting the yield of the liquid crystal display.

In one aspect of the present disclosure, the present disclosure provides a method for manufacturing an array substrate. In order to facilitate to understand, the brief description will firstly be given to the principle of the method according to an embodiment of the present disclosure below.

Figure 2:
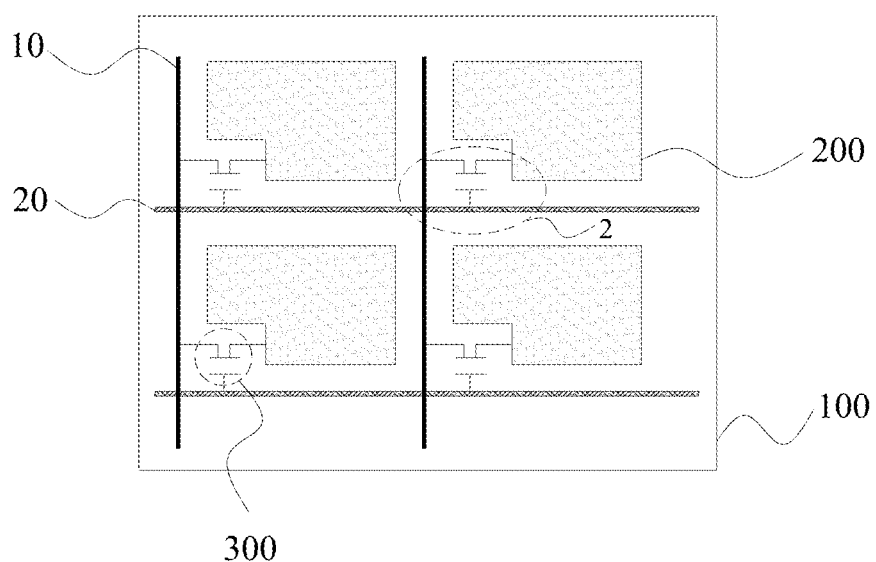
FIG. 2 is a plan view illustrating the array substrate in prior art.
Figure 3:
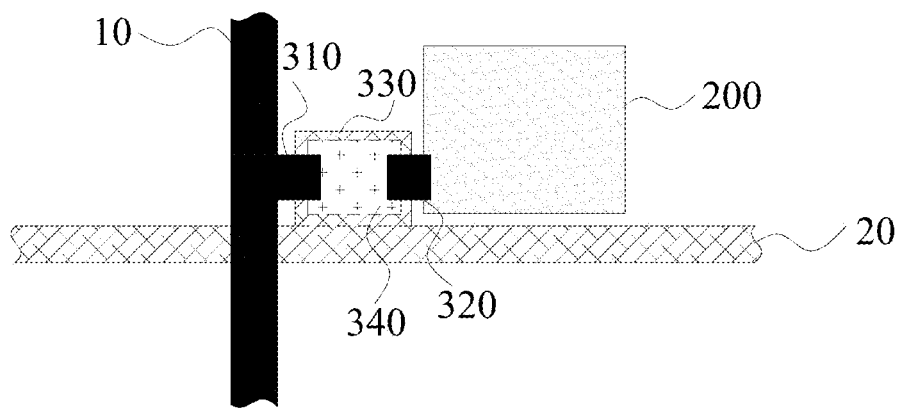
FIG. 3 is a schematic diagram illustrating a structure as shown in the portion 2 in FIG. 2.
Figure 4:
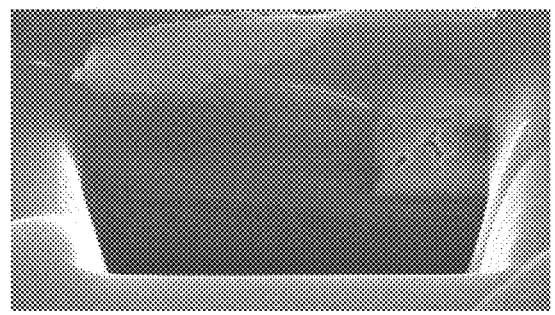
FIG. 4 is a scanning electron micrograph showing a current film transistor after undergoing a short circuit due to static electricity.

As described above, during manufacturing of the array substrate, the manufactured pixel electrode is formed of an ITO layer. Since the ITO has metal property, static electricity may be accumulated on the pixel electrode and may further cause various deficiencies. In addition, some processes such as magnetron sputtering and chemical vapor deposition are employed during manufacturing, which may also result in generation of static electricity. Specifically, referring to FIG. 2, the array substrate is formed of a substrate 100, first electrodes 200 and thin film transistors 300, and gate lines 20 and signal lines 10 are disposed on the array substrate. The static electricity accumulated during manufacturing may be discharged through the passage 2 which may disable the thin film transistors 300. Specifically, referring to FIG. 3, the film transistor includes a gate line 330, a gate insulating layer (not shown), an active layer 340, a source 310, and a drain 320. Static electricity may be discharged through the drain 320 connected with the first electrode 200 and may cause breakdown of the active layer 340 and the gate insulating layer, such that the source 310, the drain 320 and the gate 330 are shorted with each other (as shown in FIG. 4), thereby disabling the film transistor.

As described above, since the used manufacturing method may lead to accumulation of static electricity in the procedure for manufacturing the array substrate, it is difficult to solve the above-identified problem about shorting by preventing the generation of static electricity. The inventor has found that if a path with a resistor less than that on the above passage is formed, it is easy to prevent the above electrostatic breakdown problem for the film transistor. According to an embodiment of the present disclosure, it is possible to enable the first electrode, the second electrode and the signal line to have the same potential, which, on one hand, can prevent the deficiency caused by respective electrostatic discharge of the first electrode, the second electrode and the signal line, and on other hand, can design the path for electrostatic discharge, such that electrostatic damage to the film transistor may be prevented, thereby preventing the deficiency caused by electrostatic breakdown. Further, the above method may not have significant influence on the manufacturing procedure of the array substrate, therefore, it is beneficial to the existing manufacturing procedure and prevent electrostatic breakdown. Thereby, the various deficiencies caused by electrostatic breakdown during manufacturing can be eliminated by the simple manufacturing procedure.

Figure 1:
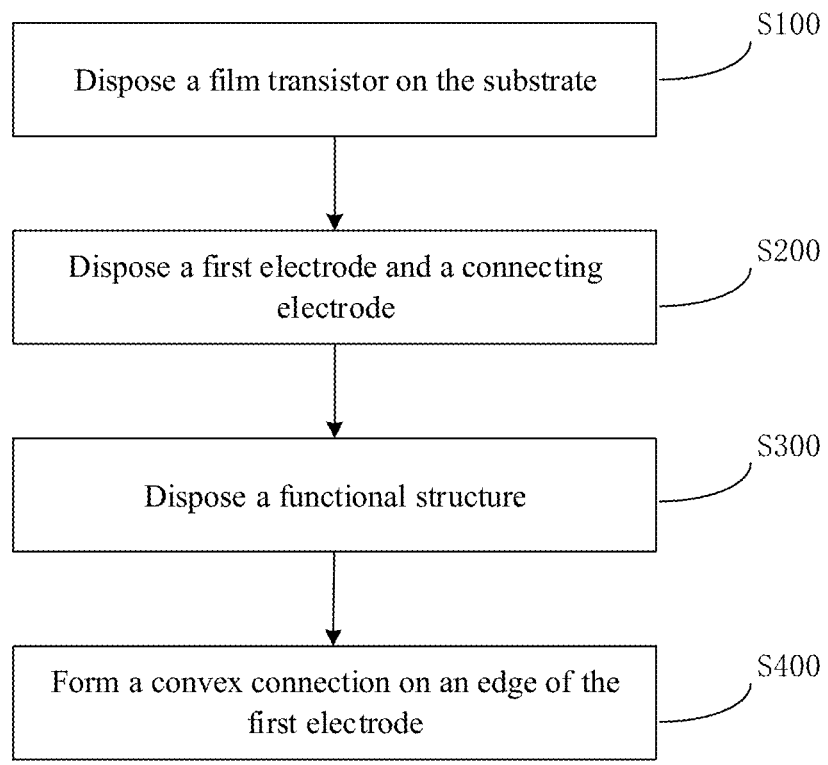
FIG. 1 is a flowchart illustrating a method for manufacturing an array substrate according to an embodiment of the present disclosure.

The detailed description will be given to the method according to the specific embodiment of the present disclosure. According to an embodiment of the present disclosure and referring to FIG. 1, the method may include the following steps.

In S100, thin film transistors are disposed on the substrate.

According to an embodiment, in this step, thin film transistors are disposed on the substrate. As described above, the film transistor may be used as a switch device to control the pixel electrode and the common electrode to generate an electric field for driving the liquid crystal to deflect, thereby realizing display. According to the embodiment, there is provided a plurality of thin film transistors arranged in an array on the substrate, each of which is connected with the corresponding pixel electrode so as to realize the control of the pixel electrode. It is appreciated for those skilled in the art that the film transistor may include structures such as a gate, a gate insulating layer, an active layer, a source, a drain and the like. Based on the above, in the procedure for disposing the film transistor on the substrate, firstly, a first metal layer is deposited and a gate and a gate line is formed by etching; a gate insulating layer and an active layer are deposited subsequently; finally, a second metal layer is deposited and a source, a drain and a signal line are formed by etching, thereby enabling the film transistor to be functional. According to the embodiment of the present disclosure, the gate line and the signal line are formed at the same time during manufacturing of the film transistor, thereby simplifying the manufacturing procedure.

In S200, a first electrode and a connecting electrode are disposed.

Figure 5:
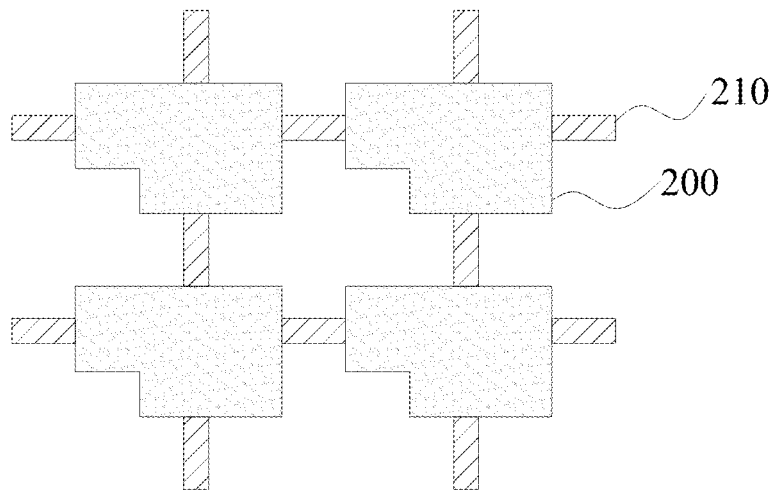
FIG. 5 is a plan view illustrating a first electrode according to an embodiment of the present disclosure.

According to an embodiment of the present disclosure, in this step, a first electrode and a connecting electrode are disposed. In the embodiment of the present disclosure, before manufacturing the signal line and the source and the drain of the film transistor, a first electrode and a connecting electrode are disposed on the substrate. According to an embodiment of the present disclosure, the connecting electrode is a strip electrode. In the embodiment of the present disclosure, a first transparent electrode layer is deposited on the substrate firstly; the first transparent electrode layer is processed by using a first pattern process subsequently so as to form a plurality of first electrodes and a plurality of connecting electrodes that are used to connect the adjacent first electrodes. As a result, the plurality of the first electrodes can be connected by the connecting electrodes and the plurality of the first electrodes can be connected so as to form an equipotential. According to the embodiment of the present disclosure, the first electrodes correspond to the thin film transistors and after manufacturing the source and the drain of the film transistor, the first electrode is connected with the drain of the film transistor. According to the embodiment of the present disclosure, the first electrodes and the connecting electrodes are formed as shown in FIG. 5. The first electrodes 200 are arranged in an array and the adjacent first electrodes 200 are connected via the connecting electrode 210. In order to have no influence on the arrangement for the first electrodes 200, it is needed to design the size of the connecting electrode 210. For example, according to the embodiment of the present disclosure, the size of the connecting electrode 210 may be 3×3-4×50 µm. The first electrode may be used as the pixel electrode or the common electrode of this array substrate.

There is no specific limitation to the first pattern process and the person skilled in the art can design it according to actual need. For example, according to an embodiment of the present disclosure, the first pattern process may be photolithography process. Specifically, the predetermined mask is used to perform photolithography process based on the first transparent electrode layer, such that the first electrodes and the connecting electrodes that are used to connect the adjacent first electrodes are formed. According to an embodiment of the present disclosure, the first transparent electrode layer may be formed of ITO.

In S300, a functional structure is disposed.

Figure 6:
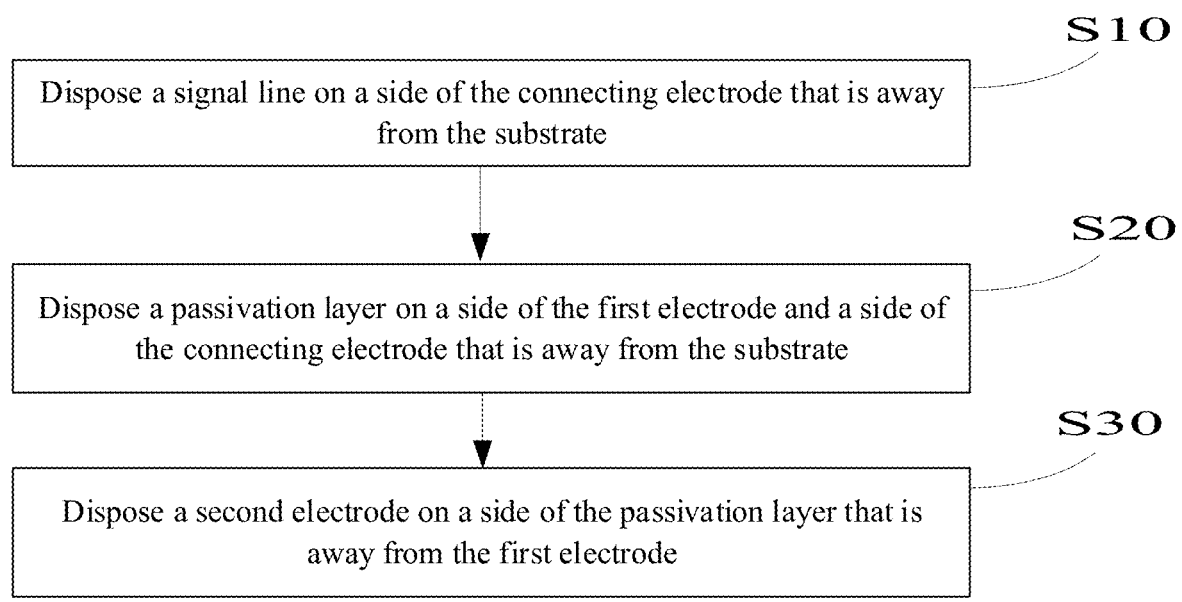
FIG. 6 is a partial flowchart illustrating a method for manufacturing an array substrate according to an embodiment of the present disclosure.

According to an embodiment of the present disclosure, in this step, a functional structure is disposed. The functional structure is disposed on a side of the first transparent electrode layer that is away from the substrate. According to an embodiment of the present disclosure, referring to FIG. 6, disposing the functional structure includes:

S10: disposing signal lines on a side of the connecting electrodes that are away from the substrate.

According to an embodiment of the present disclosure, in this step, signal lines are disposed on sides of the connecting electrodes that are away from the substrate. According to the embodiment of the present disclosure, after manufacturing the first electrodes and the connecting electrodes, the film transistor and the signal line are formed subsequently. Specifically, a second metal layer is deposited on a side of the first electrode and a side of the connecting electrode that are away from the substrate, a predetermined mask is used to form a source, a drain and a signal line by etching. As a result, the signal line, the source and the drain can be formed at the same time, which simplifies the manufacturing procedure. According to an embodiment of the present disclosure, the formed signal line is disposed on the side of the connecting electrode that is away from the substrate and covers a part of the connecting electrode. Thereby, the signal line and the connecting electrode are connected to form the equipotential.

As described above, the ITO layer that is used to form the first electrode has electrical conductivity, as a result, static electricity may be accumulated on the first electrode and may be discharged from the first electrode, through the drain of the film transistor and into the film transistor, such that the active layer and the gate insulating layer are broken down, thereby shorting the source, the drain and the gate and infecting the usage of the film transistor. According to an embodiment of the present disclosure, by electrically connecting the signal line with the first electrode to form the equipotential, it is possible for the static electricity accumulated on the first electrode to be an entirety; and then by the designed path for electrostatic discharge, the static electricity can be discharged via the designed path, which prevents the static electricity from being directed into the film transistor, thereby it is possible to protect the film transistor.

In S20, a passivation layer is disposed on a side of the first electrode and a side of the connecting electrode that are away from the substrate.

Figure 7:
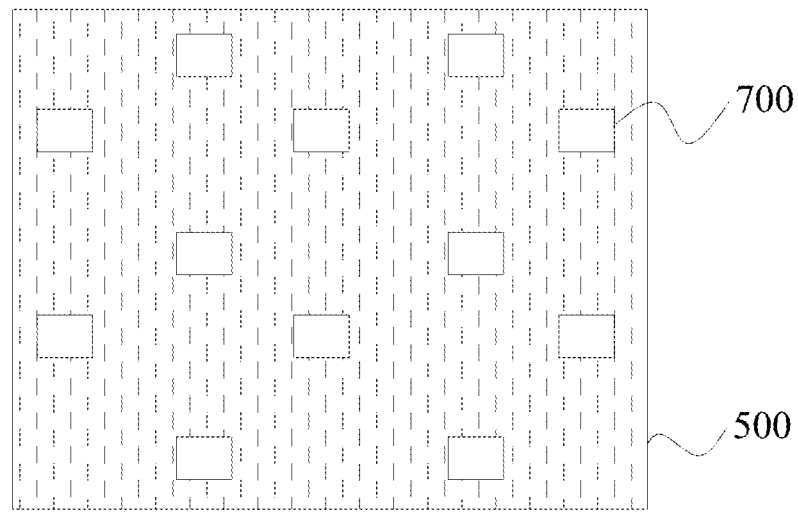
FIG. 7 is a plan view illustrating a passivation layer according to an embodiment of the present disclosure.

According to an embodiment of the present disclosure, in this step, a passivation layer is disposed on a side of the first electrode and a side of the connecting electrode that are away from the substrate. According to the embodiment of the present disclosure, a passivation layer is deposited on a side of the first electrode and a side of the connecting electrode that are away from the substrate firstly, and subsequently, based on this passivation layer, a first via is formed at a position corresponding to the connecting electrode by using a third pattern process. There is no specific limitation to the third pattern process and the person skilled in the art can design it according to actual need. For example, according to an embodiment of the present disclosure, the third pattern process may be photolithography process, such that the first via can be formed at the position of the passivation layer corresponding to the connecting electrode. According to an embodiment of the present disclosure, the formed passivation layer is as shown in FIG. 7 and the first vias 700 are disposed at the positions of the passivation layer 500 corresponding to the connecting electrodes. As a result, the connecting electrode can be electrically connected with the second electrode that is manufactured subsequently through the first via, so as to enable the first electrode, the second electrode and the signal line to form the equipotential to eliminate various deficiencies caused by electrostatic breakdown. According to the embodiment of the present disclosure, the size of the first via on the connecting electrode at the same time. As a result, an independent first electrode is formed, thereby realizing the display function of the first electrode.

There is no specific limitation to the second pattern process and the person skilled in the art can design it according to actual need. For example, according to an embodiment of the present disclosure, the second pattern process may be photolithography process, and by etching the second transparent electrode layer and the connecting electrode, the second via, the connection and the signal line connection can be formed at the same time. As a result, the independent first electrode is formed. According to an embodiment of the present disclosure, the etchant used to etch the transparent electrode layer may not etch the first metal layer (the gate, the gate line) and the second metal layer (the source, the drain, the signal line), thus when etching the connecting electrode, since the signal line covers the connecting electrode, the portion of the connecting electrode under the signal line may not be etched, thereby forming a signal line connection. According to an embodiment of the present disclosure, the above structure and the etchant may have the following components as shown in the table below.

| Material | Etchant | reaction mechanism |
| --- | --- | --- |
| Gate-AL | H3P04 + CH3COOH + HNO3 + H2O | 4AL + 2HNO3 → 2AL2O3 + N2 + H2<br>H3PO4 + AL2O3 → AL(PO4) + H2O<br>CH3COOH buffer, adjustment for concentration<br>H2O decrease ETCHANT viscosity |
| S/D-Mo | H3P04 + CH3COOH + HNO3 + H2O | 4Mo + 2HNO3 → 2Mo2O3 + N2 + H2<br>H3PO4 + Mo2O3 → Mo(PO4) + H2O<br>CH3COOH buffer, adjustment for concentration<br>H2O decrease ETCHANT viscosity |
| ITO | HCL + HNO3 + H2O | In2O3 + 6HCL → 2In3+ + 6CL− + 3H2O | matches the size of the connecting electrode so as to be suitable for electrical connection of the second electrode manufactured subsequently with the connecting electrode. For example, according to an embodiment of the present disclosure, the size of the first via 700 may be 8×8-9×55 μm.

In S30, a second transparent electrode is disposed on a side of the passivation layer that is away from the first electrodes.

According to an embodiment of the present disclosure, in this step, a second transparent electrode is disposed on a side of the passivation layer that is away from the first electrodes and the second electrode can be used as the pixel electrode or the common electrode of this array substrate.

In S400, a convex connection is formed on an edge of the first electrode.

According to an embodiment of the present disclosure, in this step, a convex connection is formed on an edge of the first electrode. The connecting electrode processed by the second pattern process is disconnected by a second via to form the connection, and at the position with a signal line, to form not only the connection, but also the signal line connection. As a result, the array substrate according to the present disclosure is formed and various deficiencies caused by electrostatic breakdown during manufacturing of the array substrate can be eliminated. According to an embodiment of the present disclosure, the second transparent electrode layer at the first via and the connecting electrode are processed by the second pattern process and the connecting electrode is disconnected, such that a second via can be formed on the second transparent electrode layer and a connection and a signal line connection can be formed based In summary, the gate line and the gate may be formed of aluminum, the source, the drain and the signal line may be formed of molybdenum, the etchant used to etch the transparent electrode layer may be a mixed solution including hydrochloride and nitric acid, and the etchant used to etch aluminum and molybdenum may be a mixed solution including orthophosphoric acid, ethylic acid and nitric acid, thus, when etching the transparent electrode layer, the gate line, the gate, the signal line, the source and the drain may not be etched and thereby a signal line connection is formed under the signal line.

According to an embodiment of the present disclosure, the size of the second via is not greater than that of the first via. As a result, after processing the second transparent electrode layer and the connecting electrode by using the second pattern process, the independent first electrode can be formed and at the same time, and the second electrodes may be connected to each other at a position except for the position corresponding to the second via. As a result, it is achieved that the film transistor controls the first electrode and the second electrode and an electric field is formed between the first and second electrodes so as to realize the display function.

According to an embodiment of the present disclosure, the purpose for forming the second via is to be disconnected the connecting electrode and form the independent first electrode, thus, the size of the second via shall meet the conditions for disconnection of the connecting electrode. According to an embodiment of the present disclosure, assuming that the horizontal direction is the length direction and the vertical direction is the width direction, the width of the second via needs to be larger than the width of the connecting electrode, such that the disconnection in the width direction for the connecting electrode can be realized. It is possible to provide the width of the second via to be larger than that of the connecting electrode, however, in order to ensure the disconnection in the width direction for the connecting electrode and prevention of the influence on the first electrode caused by the connecting electrode that is not disconnected, it prefers to provide the width of the second via to be greater than the width of the connecting electrode. In addition, according to an embodiment, the length of the second via needs to be smaller than the length of the connecting electrode, such that, on one hand, the connecting electrode may be disconnected in the length direction and on other hand, the first electrode may avoid being etched and it may ensure the usage of the first electrode. Thus, the size of the second via needs to meet the above conditions. As described above, the size of the connecting electrode is 3×3-4×50 µm, the size of the first via is 8×8-9×55 µm. Thus, according to an embodiment of the present disclosure, the size of the second via may be 2×4-3×55 µm. For the specific sizes of the strip electrode, the first via and the second via, it is possible for those skilled in the art to be selected within the above numerical range and it is needed to meet the size relationship there-between. In view of the above, the independent first electrode and the second electrode that is connected with each other at a position except for the position corresponding to the second via can be obtained.

As described above, according to the embodiment of the present disclosure, during manufacturing the second electrode, the second transparent electrode layer and the connecting electrode are processed by the second pattern process.

Figure 8:
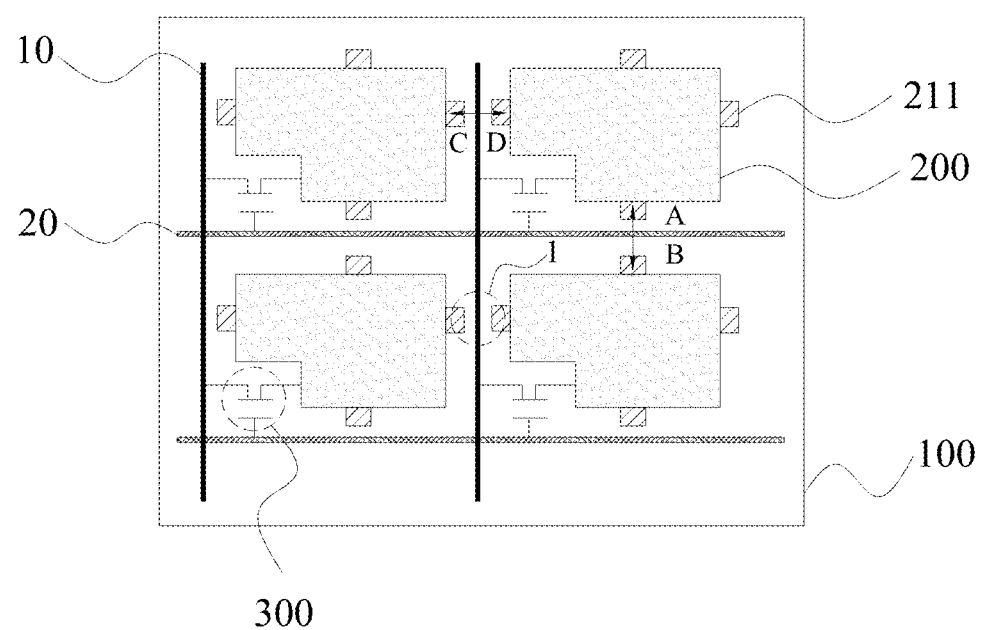
FIG. 8 is a plan view illustrating an array substrate according to an embodiment of the present disclosure.

According to an embodiment of the present disclosure, the array substrate manufactured by the method is shown as FIG. 8 and includes: a substrate 100, a first electrode 200, a connection 211, a film transistor 300, a signal line connection, a passivation layer and a second electrode (not shown). In addition, there are provided with a gate line 20 and a signal line 10 on the array substrate. The brief description will be given to the manufacturing procedure for the portions A-B and C-D in FIG. 8 according to the specific embodiments of the present disclosure.

Figure 9:
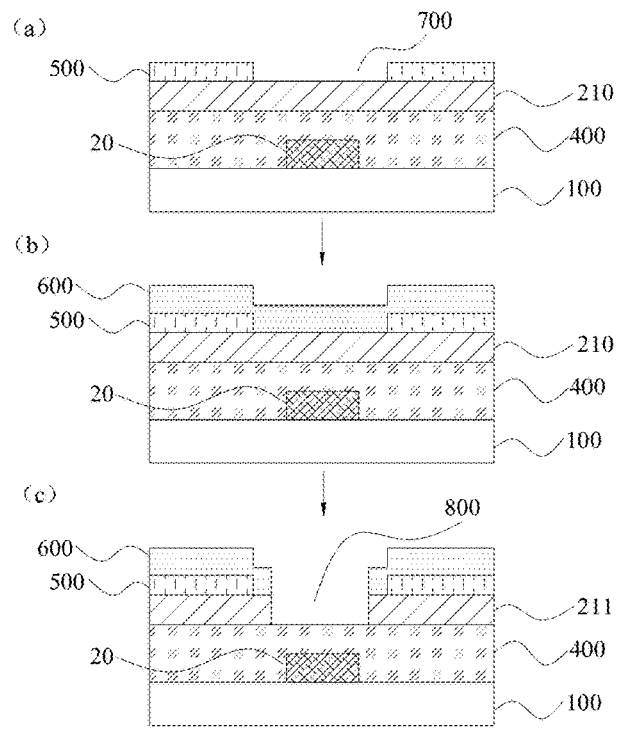
FIG. 9 is a schematic diagram illustrating a structure and a manufacturing flowchart taken along the cross-section A-B as shown in FIG. 8.

According to an embodiment, referring to FIG. 9, the manufacturing procedure for the portion A-B is as follows. The film transistor and the gate line 20 are manufactured on the substrate 100 at the same time. Subsequently, the gate insulating layer 400 and the first transparent electrode layer are deposited on the substrate and the first transparent electrode layer is processed by the first pattern process to form the connecting electrode 210. Next, a passivation layer 500 is deposited on the connecting electrode 210 and a first via 700 is disposed at the position of the passivation layer 500 corresponding to the connecting electrode 210, as shown in (a) of FIG. 9. The size of the first via has been described in detail and repeated description is omitted here. Next, the second transparent electrode layer is deposited on a side of the passivation layer 500 that is away from the connecting electrode 210 as shown in (b) of FIG. 9. Finally, the second transparent electrode layer the connecting electrode 210 are processed by the second pattern process to form the second via 800 and the connection 211, as shown in (c) of FIG. 9. As a result, the independent first electrode and the second electrode that is connected with each other at a position except for the position corresponding to the second via are formed. The size of the second via has been described in detail and repeated description is omitted here.

According to an embodiment of the present disclosure, referring to FIG. 10, the manufacturing procedure for the portion C-D is as follows. Firstly, the gate insulating layer 400 and the first transparent electrode layer are deposited on the substrate 100, and the first transparent electrode layer is processed by the first pattern process to form the connecting electrode 210. Subsequently, a signal line 10 is disposed on a side of the connecting electrode 210 that is away from the gate insulating layer 400. According to an embodiment, the signal line 10 is manufactured while manufacturing the source and the drain of the film transistor on the substrate 100. Subsequently, a passivation layer 500 is deposited on a side of the connecting electrode 210 and a side of the signal line 10 that are away from the gate insulating layer 400 and a first via 700 is disposed at the position of the passivation layer 500 corresponding to the connecting electrode 210, as shown in (a) of FIG. 10, the signal line 10 is located into the first via 700. The size of the first via has been described in detail and repeated description is omitted here. Next, the second transparent electrode layer is deposited on the passivation layer 500 and a side of the signal line 10 that is away from the connecting electrode 210, as shown in (b) of FIG. 10. Finally, the second transparent electrode layer and the connecting electrode 210 are processed by using the second pattern process to form the second via 800, a connection 211 and a signal line connection 212 under the signal line 10, as shown in (c) of FIG. 10. As a result, the independent first electrode and the second electrode that is connected with each other at a position except for the position corresponding to the second via are formed. The size of the second via has been described in detail and repeated description is omitted here.

According to the embodiment of the present disclosure, by designing the electrostatic discharge path (specifically, the path 1 as shown in FIG. 8), it can be avoided for the film transistor to be disabled due to breakdown. According to an embodiment of the present disclosure, the connection area between the connecting electrode and the signal line at the path 1 is large enough, such that the contact resistance is small enough and is smaller than the contact resistance of the path 2 in prior art. As a result, the static electricity may preferentially pass through the path 1 and avoid passing through the path 2. Thus, it is possible to protect the film transistor and improve the deficiencies due to static electricity.

In another aspect of the present disclosure, the present disclosure provides an array substrate. According to the embodiment of the present disclosure, the array substrate is manufactured by the above-identified method and as a result, the array substrate possesses all features and advantages of the above mentioned array substrate, the repeated description will be omitted here. In a word, the array substrate cannot be affected by the static electricity accumulated during the manufacturing of this array substrate and possesses a relative high yield.

In another aspect of the present disclosure, the present disclosure provides an array substrate. According to an embodiment of the present disclosure, the array substrate is manufactured by the above-identified method and as a result, the array substrate possesses all features and advantages of the above mentioned array substrate, the repeated description will be omitted here. According to an embodiment of the present disclosure, referring to FIG. 8, the array substrate may include a substrate 100, a film transistor 300, a first electrode 200 and a connection 211. A plurality of the film transistor 300 is disposed on the substrate 100, a plurality of the first electrode 200 arranged in an array is connected with the drains of the film transistor 300 and an edge of the first electrode 200 has a convex connection 211 applicable to connect the adjacent first electrodes 200 to form an equipotential during manufacturing the array substrate. Thus, the array substrate cannot be affected by the static electricity accumulated during the manufacturing of this array substrate and possesses a relative high yield.

The detailed description will be given to the respect structure of this array substrate according to the specific embodiments below.

According to an embodiment of the present disclosure, the connections 211 on the edges of the adjacent first electrodes 200 are disposed opposite to each other. According to an embodiment, during manufacturing, the connection 211 is formed of the connecting electrode and as a result, the connections 211 on the edges of the adjacent first electrodes 200 are disposed opposite to each other. According to an embodiment of the present disclosure, the first electrode 200 has four edges, each of which has the one connection 211. As a result, the first electrodes can be connected by the connections during manufacturing, such that the plurality of the first electrodes can form an equipotential.

Figure 10:
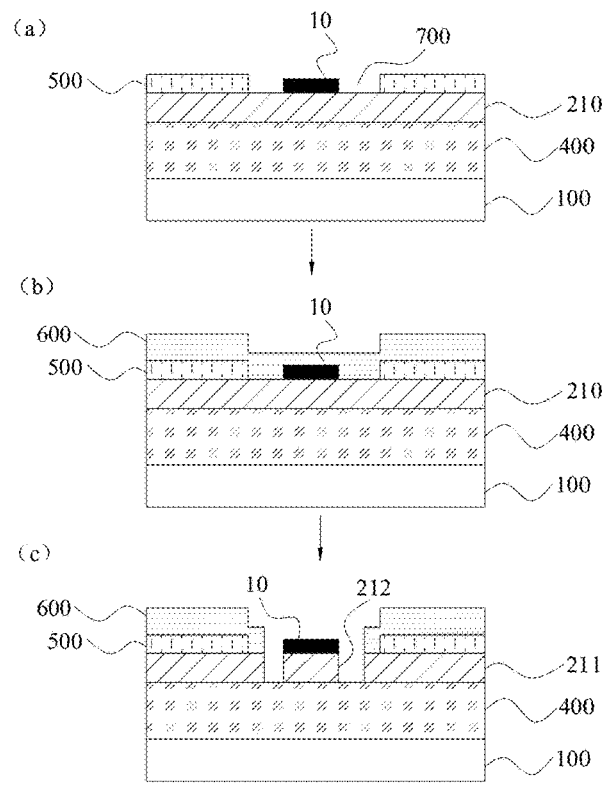
FIG. 10 is a schematic diagram illustrating a structure and a manufacturing flowchart taken along the cross-section C-D as shown in FIG. 8.

According to an embodiment of the present disclosure, referring to (c) of FIG. 10, the array substrate may further include a signal line connection 212 and a signal line 10. According to an embodiment, the signal line connection 212 is formed of the connecting electrode during manufacturing. As a result, the signal line connection 212 is disposed on the same layer as the layer where the first electrode is disposed and is independently disposed in the gap between the two adjacent first electrodes. According to an embodiment of the present disclosure, the signal line 10 is disposed on a side of the signal line connection 212 that is away from the substrate 100 and covers the signal line connection 212. As a result, the potential of the signal line is same as the potential of the first electrode during manufacturing, and thereby, various deficiencies due to electrostatic breakdown can be eliminated. According to an embodiment, the array substrate may include a plurality of the signal line connections 212 and a plurality of the signal lines 10. The signal line connections 212 are disposed in a row direction or a column direction of the plurality of the first electrodes that are arranged in the array and an extension direction of the signal line 10 is the same as the direction in which the signal line connections 212 are disposed. As a result, the direction where the signal line connection is disposed is the same as the direction where the signal line is disposed, which can ensure that the signal line is electrically connected with the first electrode, thereby form the equipotential and eliminating various deficiencies due to electrostatic breakdown.

According to an embodiment of the present disclosure, the connection 211 and the signal line connection 212 are formed of the connecting electrodes during the manufacturing. That is to say, the connections 211 and the signal line connections 212 are arranged on the same layer and formed of the same material. As a result, the number and the position of the signal line connections correspond to those of the connections.

According to an embodiment, the array substrate may further include a gate insulating layer 400, a passivation layer 500 and a second electrode 600. The gate insulating layer 400 is disposed on the substrate 100 and located between the gate line 20 and the first electrode 200. The passivation layer 500 is on a side of the first electrode 200 that is away from the gate insulating layer 400, and there is provided with a first via 700 in the passivation layer 500. The first via 700 is used to connect the connecting electrode with the second transparent electrode layer. The size of the first via has been described in detail and repeated description is omitted here. The second electrode 600 is disposed on a side of the passivation layer 500 that is away from the first electrode 200 and there is provided a second via 800 on the second electrode 600. The size of the second via 800 is not greater than that of the first via 700. As a result, the first electrode and the second electrode may form an equipotential via the first via, while an independent first electrode may be formed via the second via, which can enable the array substrate to be functional. The size of the second via has been described in detail and repeated description is omitted here.

According to an embodiment of the present disclosure, the first electrode, the second electrode and the signal line are form an equipotential during manufacturing of the array substrate such that the static electricity may be an entirety, which, on one hand, can prevent the deficiency caused by respective electrostatic discharge of the first electrode, the second electrode and the signal line, and on other hand, can design the path for electrostatic discharge, such that electrostatic damage to the film transistor may be prevented, thereby preventing the deficiency caused by electrostatic breakdown. As a result, the various deficiencies caused by electrostatic breakdown can be eliminated by the simple manufacturing procedure during manufacturing. The electrostatic discharge path has been described in detailed and the repeated description is omitted here.

In order to facilitate to understand, the brief description will be given to the method for preventing static electricity during manufacturing the array substrate according to the embodiment of the present disclosure.

Figure 11:
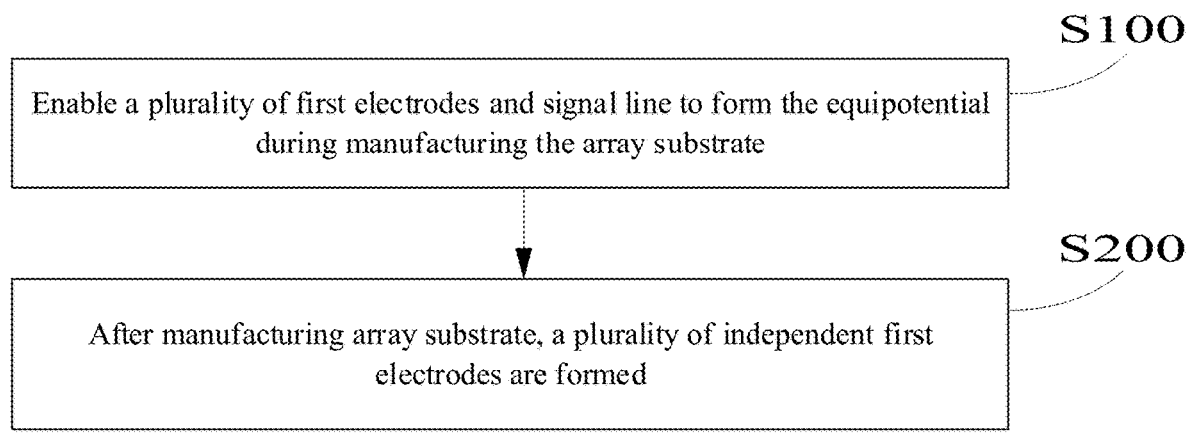
FIG. 11 is a flowchart illustrating a method for preventing static electricity during manufacturing an array substrate according to an embodiment of the present disclosure.

According to the embodiment of the present disclosure, referring to FIG. 11, the method for preventing static electricity may include the following steps.

In S100, a plurality of the first electrodes are formed to be an equipotential during manufacturing the array substrate.

According to an embodiment of the present disclosure, in this step, a plurality of the first electrodes are formed to be an equipotential. According to an embodiment of the present disclosure, during manufacturing the array substrate, the first electrode is disposed while the connecting electrode that is used to connect the adjacent first electrodes is formed, such that the plurality of the first electrodes are formed to be an equipotential. According to an embodiment, during subsequent manufacturing process, a signal line is disposed on a side of the connecting electrode that is away from the substrate, as a result, the signal line and the first electrode are formed to be the equipotential. According to an embodiment of the present disclosure, the equipotential may further include the second electrode that is formed in the following manufacturing processes. According to an embodiment, the second electrode is connected with the connecting electrode by the first via in the passivation layer, such that the first and second electrodes are formed to be the equipotential. That is to say, the static electricity accumulated on the first electrode and the static electricity generated by the manufacturing processes in the following procedure may be an entirety, and thereby respective electrostatic discharge may not occur and various deficiencies may not be caused. Subsequently, by designing the electrostatic discharge path, the entire static electricity may be discharged from the designed path and thereby, various deficiencies may be prevented. The electrostatic discharge path has been described in detail and the repeated description will be omitted here.

In S200, after the array substrate has been manufactured, a plurality of independent first electrodes are formed.

According to an embodiment of the present disclosure, in this step, a plurality of independent first electrodes are formed. According to an embodiment, the second electrode is connected with the connecting electrode by the first via in the passivation layer, such that the first and second electrodes are formed to be the equipotential. In order to enable the first and second electrodes to be functional, it is needed to form the independent first electrode. According to an embodiment of the present disclosure, the connecting electrode at the first via and the second electrode are processed by using the second pattern process, so as to form the independent first electrode. As a result, it can prevent the array substrate from being affected adversely by the static electricity that is accumulated during manufacturing and enable the array substrate to be functional.

In another aspect of the present disclosure, the present disclosure provides a display device. According to an embodiment, the display device includes the above-mentioned array substrate and as a result, the display device possesses all features and advantages of the above mentioned array substrate, the repeated description will be omitted here. In a word, the display device possesses a relative high yield.

In an aspect of the present disclosure, the present disclosure provides a method for manufacturing an array substrate which may include the following steps.

A plurality of thin film transistors arranged in an array is disposed on the substrate;

A first transparent electrode layer is deposited on the substrate and the first transparent electrode layer is processed by using a first pattern process, so as to form a plurality of first electrodes connected with the drains of the film transistors, and a connecting electrode connecting adjacent ones of the first electrodes;

A functional structure is disposed on a side of the first transparent electrode layer that is away from the substrate;

The connecting electrode is processed by using a second pattern process and the connecting electrode is disconnected, so as to form a convex connection on an edge of the first electrode.

Thereby, the various deficiencies caused by electrostatic breakdown during manufacturing can be eliminated by the simple manufacturing processes.

According to an embodiment, the disposing the functional structure may include:

disposing a signal line on a side of the connecting electrode that is away from the substrate;

disposing a passivation layer on a side of the first electrode and a side of the connecting electrode that are away from the substrate; and depositing a second transparent electrode layer on a side of the passivation layer that is away from the first electrode and forming a second electrode. As a result, it is possible to enable the signal line and the first electrode to form an equipotential and eliminate the various deficiencies on the first electrode which are caused by the electrostatic breakdown.

According to an embodiment, the method may further include:

processing the passivation layer by using a third pattern process such that a first via is formed at a position corresponding to the connecting electrode. As a result, the second electrode and the connecting electrode can be connected through the first via to form the equipotential and eliminate the various deficiencies caused by the electrostatic breakdown during manufacturing.

According to an embodiment, after forming the first via, the method may further include:

processing the second transparent electrode layer at the first via and the connecting electrode by using the second pattern process such a that second via is formed on the second transparent electrode layer, and forming the connection and the signal line connection based on the connecting electrode.

The size of the second via is not greater than that of the first via.

As a result, the independent first electrode and the second electrodes that are closed up with each other are formed to enable the array substrate to be functional.

In another aspect of the present disclosure, the present disclosure provides an array substrate. According to an embodiment, the array substrate is manufactured by the above-identified method and as a result, the array substrate possesses all features and advantages of the above mentioned array substrate, the repeated description will be omitted here. In a word, the array substrate cannot be affected by the static electricity accumulated during the manufacturing of this array substrate and possesses a relative high yield.

In another aspect of the present disclosure, the present disclosure provides an array substrate. According to an embodiment of the present disclosure, the array substrate may include a substrate, a plurality of thin film transistors disposed on the substrate, a plurality of first electrodes arranged in an array which are connected with the drains of the film transistors. An edge of the first electrode has a convex connection applicable to connect the adjacent first electrodes to form an equipotential. As a result, the array substrate cannot be affected by the static electricity accumulated during the manufacturing of this array substrate and possesses a relative high yield.

According to an embodiment, the connections between the adjacent first electrodes are disposed opposite to each other. As a result, the first electrodes can be connected by using the connection during manufacturing, so as to enable the plurality of the first electrode to form an equipotential.

According to an embodiment of the present disclosure, the first electrode has four edges, each of which has the one connection. As a result, it is better for realization of the electrical connection between the first electrodes.

According to an embodiment, the array substrate may further include: a signal line connection, disposed on the same layer as the layer where the first electrode is disposed, and independently disposed in the gap between the two adjacent first electrodes; and a signal line, disposed on a side of the signal line connection that is away from the substrate and covering the signal line connection. As a result, it is possible to enable the signal line and the first electrode to form an equipotential and eliminate various deficiencies caused by electrostatic breakdown.

According to an embodiment, the array substrate may include a plurality of the signal line connections which are disposed in a row direction or a column direction of the plurality of the first electrodes that are arranged in the array. An extension direction of the signal line is the same as the direction in which the signal line connections are disposed. As a result, it can ensure that the signal line is electrically connected with the first electrode, thereby form the equipotential.

According to an embodiment of the present disclosure, the signal line connections and the connections are arranged on the same layer and formed of the same material. As a result, the number and the position of the signal line connections correspond to those of the connections.

According to an embodiment of the present disclosure, the array substrate may further include: a passivation layer, disposed on a side of the first electrode that is away from the substrate, wherein the passivation layer is disposed with a first via at a position corresponding to the connection; and a second electrode, disposed on a side of the passivation layer that is away from the first electrodes, wherein the second electrode is disposed with a second via at a position corresponding to the first via. The size of the second via is not greater than that of the first via. As a result, during manufacturing, the first electrode and the second electrode may be connected through the first via to form an equipotential, while an independent first electrode may be formed via the second via, which can enable the array substrate to be functional.

According to an embodiment of the present disclosure, the present disclosure provides a display device. According to an embodiment, the display device includes the abovementioned array substrate and as a result, the display device possesses all features and advantages of the above mentioned array substrate, the repeated description will be omitted here. In a word, the display device possesses a relative high yield.

In the description of the embodiments of the present disclosure, the orientation or location relationship indicated by terms, such as "on", "under" or the like, refer to the orientation or location relationship that is based on the orientation or the location as shown in drawings. These relationships are merely used to facilitate the description, but do not intend to limit that the present disclosure must be constituted or operated in a specific orientation, and thus will not be interpreted as limitations to the present disclosure.

In the description of the specification, the reference terms, such as "an embodiment", "another embodiment" or the like means that the specific feature, structure, material or characteristic is included in at least one embodiment of the present disclosure. In this specification, the exemplary description indicated by the above terms does not have to be directed to the same embodiment or example. And the described specific feature, structure, material or characteristic may be combined in any suitable manner in one or more embodiments or examples. In addition, if there is no conflict, it is possible for those skilled in the art that the different embodiments or examples described in this specification or the features in the different embodiments or examples may be combined. Moreover. It is noted that terms such as "first", "second" or the like in this specification are merely used to describe the present disclosure, and these terms will not be interpreted as indication or implication of relative importance or the number of the indicated technical features.

Although embodiments of the present disclosure have been shown and described, it is appreciated that the above embodiments are exemplary and do not intend to limit the present disclosure. It is possible for those skilled in the art that various changes, modifications, substitutions and variants can be made within the scope of the present disclosure.

What is claimed is:

1. A method for manufacturing an array substrate, comprising:
    disposing, on a substrate, a plurality of thin film transistors arranged in an array;
    depositing a first transparent electrode layer on the substrate and processing the first transparent electrode layer by using a first pattern process, so as to form a plurality of first electrodes connected with drains of the film transistors, and a connecting electrode connecting adjacent first electrodes;
    disposing a functional structure on a side of the first transparent electrode layer that is away from the substrate; and
    processing the connecting electrode by using a second pattern process and disconnecting the connecting electrode, so as to form a convex connection on an edge of each of the first electrode.

2. The method according to claim 1, wherein the step of disposing a functional structure comprising:
    disposing a signal line on a side of the connecting electrode that is away from the substrate;
    disposing a passivation layer on a side of each of the first electrode and the side of the connecting electrode that are away from the substrate; and
    depositing a second transparent electrode layer on a side of the passivation layer that is away from each of the first electrode and forming a second electrode by patterning the second transparent electrode layer and the connecting electrode.

3. The method according to claim 2, further comprising:
    processing the passivation layer by using a third pattern process such that a first via is formed at a position corresponding to the connecting electrode.

4. The method according to claim 3, wherein, after forming the first via, the method further comprises:
    processing the second transparent electrode layer at the first via and the connecting electrode by using the second pattern process such that a second via is formed on the second transparent electrode layer, and forming the convex connection and the signal line connection based on the connecting electrode,
    wherein a size of the second via is not greater than that of the first via.

* * * * *